US011406033B2

(12) United States Patent
Griffin

(10) Patent No.: US 11,406,033 B2
(45) Date of Patent: Aug. 2, 2022

(54) ELECTRONICS HOUSING WITH COMBINED INTERNAL HINGE AND CATCH

(71) Applicant: Sabre Communications Corporation, Sioux City, IA (US)

(72) Inventor: Chad T. Griffin, Durham, NC (US)

(73) Assignee: Sabre Communications Corporation, Sioux City, IA (US)

( * ) Notice: Subject to any disclaimer, the term of this patent is extended or adjusted under 35 U.S.C. 154(b) by 145 days.

(21) Appl. No.: 16/877,111

(22) Filed: May 18, 2020

(65) Prior Publication Data

US 2020/0389988 A1    Dec. 10, 2020

Related U.S. Application Data

(60) Provisional application No. 62/857,702, filed on Jun. 5, 2019.

(51) Int. Cl.
*H05K 5/02* (2006.01)
*H01Q 1/42* (2006.01)

(52) U.S. Cl.
CPC ......... *H05K 5/0226* (2013.01); *H05K 5/0221* (2013.01); *H05K 5/0239* (2013.01); *H01Q 1/42* (2013.01)

(58) Field of Classification Search
None
See application file for complete search history.

(56) References Cited

U.S. PATENT DOCUMENTS

| 2018/0148954 A1* | 5/2018 | Raffi | E05B 65/0007 |
| 2019/0186187 A1* | 6/2019 | Wright | E05D 11/1014 |
| 2019/0221913 A1* | 7/2019 | Castronova | H04W 88/10 |

FOREIGN PATENT DOCUMENTS

| WO | WO-2018073297 A1 * | 4/2018 | E05D 11/1007 |
| WO | WO-2019186673 A1 * | 10/2019 | B61C 17/00 |

* cited by examiner

*Primary Examiner* — Rockshana D Chowdhury
*Assistant Examiner* — Christopher L Augustin
(74) *Attorney, Agent, or Firm* — Schwegman Lundberg & Woessner, P.A.

(57) ABSTRACT

An electronics cabinet can include a cylindrical housing, providing a wall defining an interior space for locating electronics equipment therein. A cylindrical section door can be located in an access cutout defined by the wall. An internal hinge can attach an interior of the door to an interior of the wall of the cylindrical housing. The internal hinge can include a pivoting curved hinge arm. The internal hinge can also include wall mount, configured to be attached to the interior of the wall of the cylindrical housing. The internal hinge can also include a pivot connection between the hinge arm and the wall mount. The internal hinge can also include a catch, integrated with or attached to the hinge arm, the catch configured for self-engagement to inhibit opening of the door beyond a specified door opening angle, and to permit closing of the door only upon manual user-disengagement.

23 Claims, 4 Drawing Sheets

ELECTRONICS HOUSING WITH COMBINED INTERNAL HINGE AND CATCH

CLAIM OF PRIORITY

This application claims the benefit of priority of U.S. Provisional Patent Application Ser. No. 62/857,702, titled "ELECTRONICS HOUSING WITH COMBINED INTERNAL HINGE AND CATCH" to Chad T. Griffin, filed on Jun. 5, 2019, the entire contents of which being incorporated herein by reference.

TECHNICAL FIELD

This document pertains generally, but not by way of limitation, to an enclosure for housing small cell wireless communications or other electronics components, and more particularly, but not by way of limitation to a cylindrical electronics housing with a door having an integrated internal hinge and catch.

BACKGROUND

Small cell wireless communications reduces the cellular coverage area of a wireless antenna mounted high above the ground upon a long monopole or other structure, in favor of a multiplicity of smaller antennas, e.g., in high usage areas, which can instead be positioned more cheaply on or near the ground.

One example of a housing for small cell wireless communications or other electronics components can include an electronics equipment cabinet with a cylindrical housing. An interior region of the cylindrical housing can provide a shelter in which electronics components can be located and to which power can be provided. A section of the cylindrical housing can be cut out to provide a door. The door can be opened to allow access to the interior region, such as to allow installation of, removal of, or access to the electronic components housed therein. The electronics equipment cabinet can be configured to be located outdoors and exposed to the elements, such as while protecting the electronic components housed therein.

SUMMARY

The present inventor has recognized, among other things, a need to provide a door that, after opening, will not blow back toward an operator accessing the electronics housed within the interior of the cylindrical housing provided by the electronics equipment cabinet. Further, it is desirable that the door be provided an internal hinge that is not visible when viewing an external portion of the cylindrical housing. Moreover, it is desirable that the door be open at angles beyond 90 degrees, if possible. Still further, it is desirable that space within the cylindrical housing be preserved for housing electronics components, without unnecessary room being taken up by the internal hinge or any wind-stop components.

A numbered list of illustrative non-limiting aspects of the present subject matter is presented below.

Aspect 1 can include or use an electronics cabinet. The electronics cabinet can include a cylindrical housing, providing a wall defining an interior space for locating electronics equipment therein. A cylindrical section door can be located in an access cutout defined by the wall. An internal hinge can attach an interior of the door to an interior of the wall of the cylindrical housing. The internal hinge can include: a pivoting curved hinge arm; a wall mount, configured to be attached to the interior of the wall of the cylindrical housing; a pivot connection between the hinge arm and the wall mount; and a catch, integrated with or attached to the hinge arm, the catch configured for engagement to inhibit opening of the door beyond a specified door opening angle.

Aspect 2 can be optionally combined with Aspect 1 to include or use the catch including a pin.

Aspect 3 can be optionally combined with any of Aspects 1-2 to include or use a pin that includes a spring-loaded pull-pin.

Aspect 4 can be optionally combined with any of Aspects 1-3 to include or use the catch including a glide path along which the pin travels during a portion of the pivoting of the curved hinge arm.

Aspect 5 can be optionally combined with any of Aspects 1-4 to include or use a ramp providing a glide path.

Aspect 6 can be optionally combined with any of Aspects 1-5 to include or use a glide path that can include a recess such as to receive an end of the pin such as for engagement to inhibit opening of the door beyond a specified door opening angle.

Aspect 7 can be optionally combined with any of Aspects 1-6 to include or use the pin including a handle at an opposite end from the end of the pin received by the recess.

Aspect 8 can be optionally combined with any of Aspects 1-7 to include or use a thickness of the wall of the cylindrical housing being greater than a thickness of the door.

Aspect 9 can be optionally combined with any of Aspects 1-8 to include or use a plurality of the internal hinges.

Aspect 10 can be optionally combined with any of Aspects 1-9 to include or use a lock retention member, affixed to an interior of the cylindrical housing. An access opening can be defined in the door, such as can be configured to receive a portion of the lock retention member to permit access from outside of the cylindrical housing when the door is closed.

Aspect 11 can be optionally combined with any of Aspects 1-10 to include or use a catch configured for engagement to inhibit opening of the door beyond a specified door opening angle exceeding 90 degrees, or exceeding 100 degrees, or exceeding 120 degrees.

Aspect 12 can be optionally combined with any of Aspects 1-11 to include or use an internal hinge is located within an interior of the cylindrical structure and avoids having any externally protruding portions visible from outside of the cylindrical structure.

Aspect 13 can be optionally combined with any of Aspects 1-12 to include or use a catch that can be configured to remain engaged to inhibit closing of the door until a user manually disengages the catch.

Aspect 14 can be optionally combined with any of Aspects 1-13 to include or use an electronics cabinet comprising: a cylindrical housing, providing a wall defining an interior space for locating electronics equipment therein; a cylindrical section door, located in an access cutout defined by the wall; an internal hinge, attaching an interior of the door to an interior of the wall of the cylindrical housing, the internal hinge including: a pivoting curved hinge arm; a wall mount, configured to be attached to the interior of the wall of the cylindrical housing; means for allowing pivoting between the hinge arm and the wall mount; and means for self-engagement to inhibit opening of the door beyond a specified door opening angle.

Aspect 15 can be optionally combined with any of Aspects 1-14 to include or use the means for engagement to inhibit opening of the door beyond a specified door opening angle is configured to withstand a wind speed of 50 miles per hour without disengagement.

Aspect 16 can be optionally combined with any of Aspects 1-15 to include or use the internal hinge being located within an interior of the cylindrical structure and avoids having any externally protruding portions visible from outside of the cylindrical structure.

Aspect 17 can be optionally combined with any of Aspects 1-16 to include or use a catch that can be configured to remain engaged to inhibit closing of the door until a user manually disengages the catch.

Aspect 18 can be optionally combined with any of Aspects 1-17 to include or use a catch being configured for engagement to inhibit opening of the door beyond a specified door opening angle exceeding 100 degrees.

Aspect 19 can be optionally combined with any of Aspects 1-18 to include or use a method of accessing an electronics cabinet comprising a cylindrical housing, providing a wall defining an interior space for locating electronics equipment therein; a cylindrical section door, located in an access cutout defined by the wall; an internal hinge, attaching an interior of the door to an interior of the wall of the cylindrical housing, the internal hinge integrated with a catch for engagement to inhibit opening of the door beyond a specified door opening angle. The method can include: opening the door, thereby permitting the catch to self-engage the door in an open position and inhibit further opening of the door; disengaging the catch; and closing the door.

Aspect 20 can be optionally combined with any of Aspects 1-19 to include or use locking the door in a closed position.

Aspect 21 can be optionally combined with any of Aspects 1-20 to include or use permitting the catch to engage the door includes inhibiting opening of the door beyond a specified door opening angle exceeding 90 degrees.

Aspect 22 can be optionally combined with any of Aspects 1-21 to include or use inhibiting opening of the door beyond a specified door opening angle to withstand a wind speed of 50 miles per hour without disengaging the catch.

Aspect 23 can be optionally combined with any of Aspects 1-22 to include or use manually disengaging the catch to permit closing of the door.

Each of these non-limiting examples/aspects can stand on its own, or can be combined in various permutations or combinations with one or more of the other examples/aspects.

This overview s intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
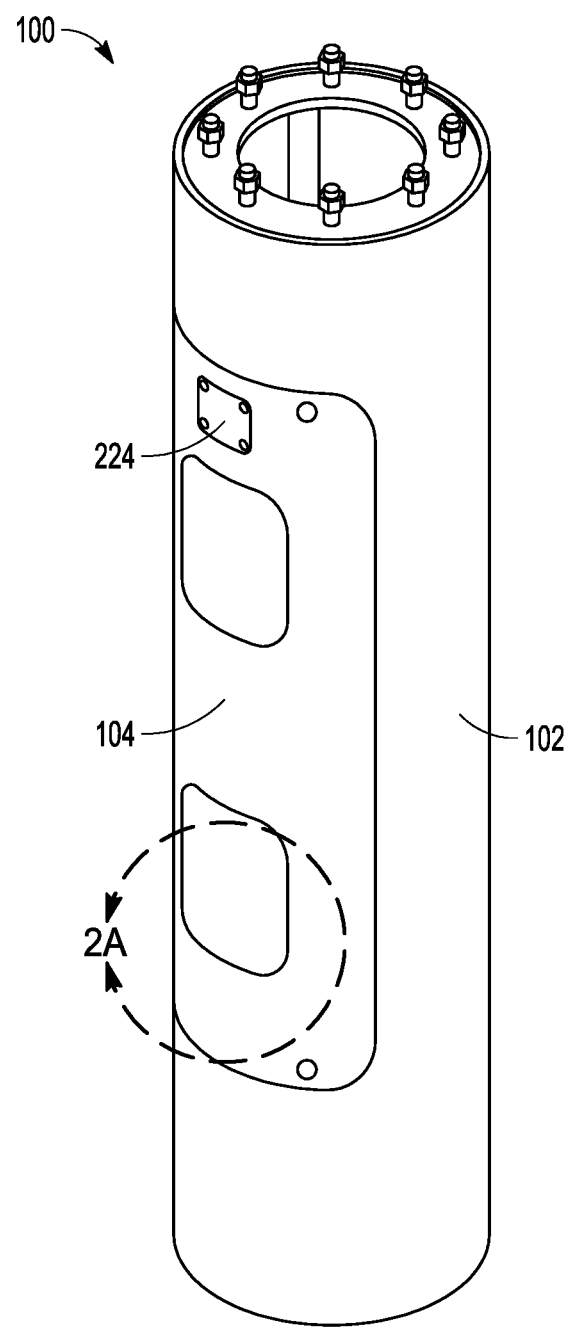
FIG. 1A is an isometric view of an example of a cylindrical enclosure with a door that is in a closed position, such as flush to the outer surface of the cylindrical enclosure.
Figure 1B:
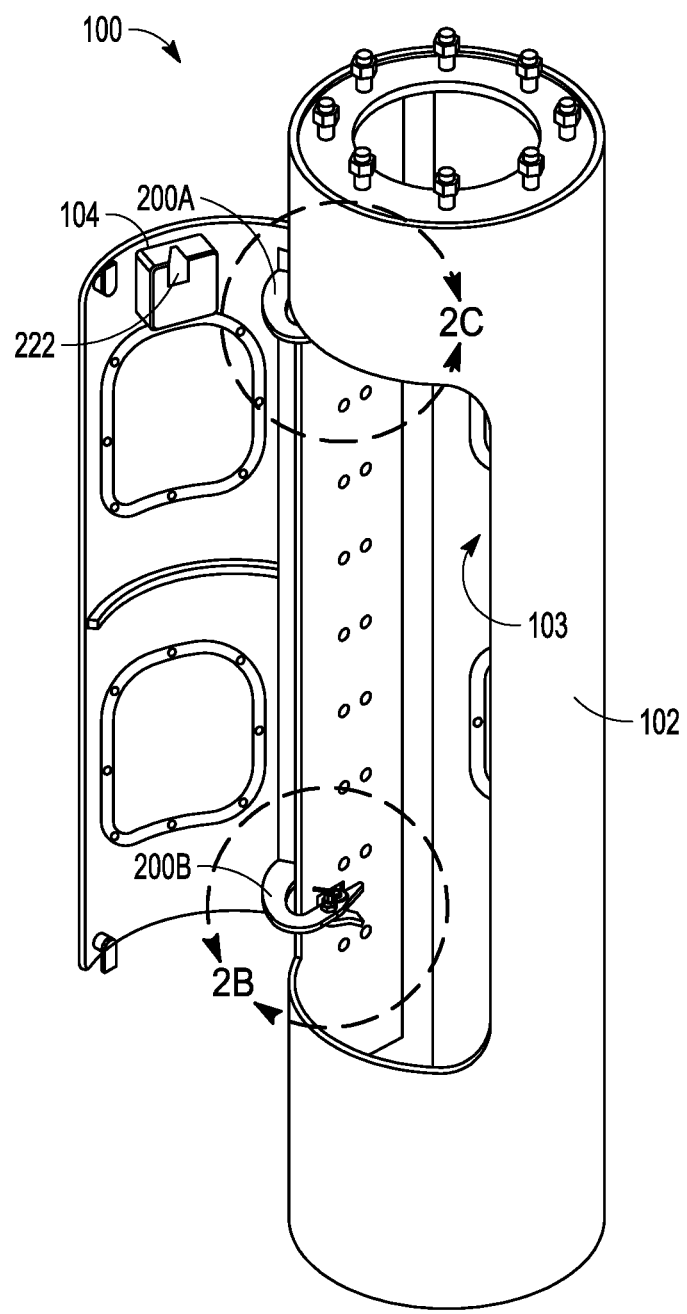
FIG. 1B is an isometric view of an example of the cylindrical enclosure with the door that is in an open position.

FIGS. 1A-1B show an illustrative example of an electronics cabinet 100. The electronics cabinet 100 can include a rounded or cylindrical housing 102. Within the housing 102, an interior space 103 can be provided, such as for housing small cell wireless communication or other electronics components to protect them from the elements when the electronics cabinet 100 is located outdoors and is exposed to the weather conditions of the surrounding environment. Power for such electronic components can be provided within the interior space 103 of the housing 102. A cylindrical section door 104 can be located in a similarly-shaped access cutout in the wall of the cylindrical housing 102, When closed, the door 104 can be flush with the housing 102 such that, together, these components can provide a smooth cylindrical outer façade. FIG. 1A shows an example of these components with the door in a closed position. FIG. 1B shows an example of these components in an open position. The door 104 can be attached to the housing 102 via an internal hinge 200 (or two or more such internal hinges 200), such as shown in the detail view of FIG. 2A (with the door closed) and in the detail view of FIG. 2B (with the door open). The internal hinge 200 completely avoids having any externally protruding or visible portions, such as may otherwise be the case with an alternative non-internal hinge, which may otherwise disturb the appearance of the smooth cylindrical outer façade, or which may be more prone to external tampering by an unauthorized person seeking to gain access to the interior space 103.

Figure 2A:
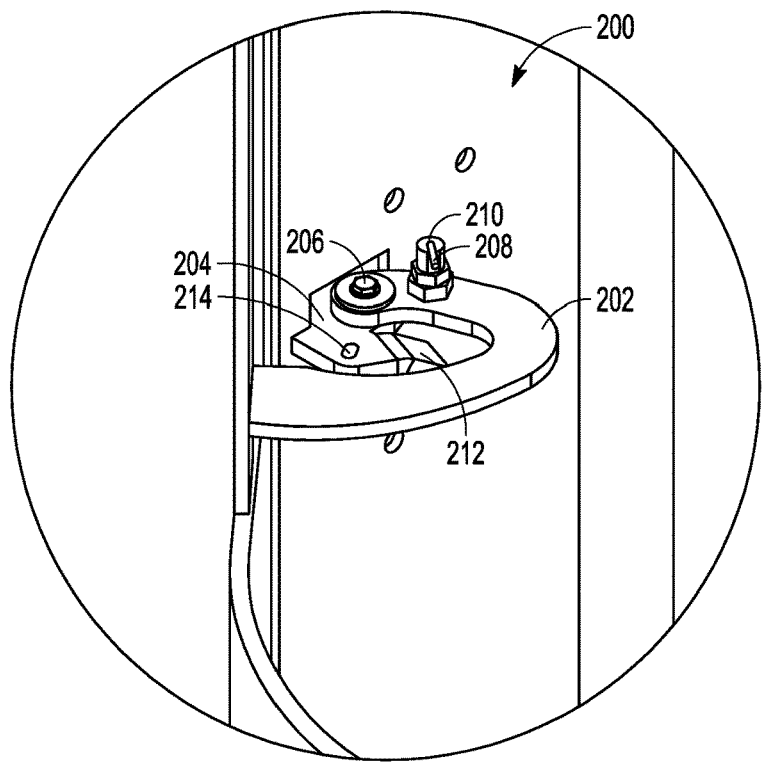
FIG. 2A is a detailed internal view of the region indicated in FIG. 1A, showing an example of a hinge arm and a catch when the door is in a closed position.
Figure 2B:
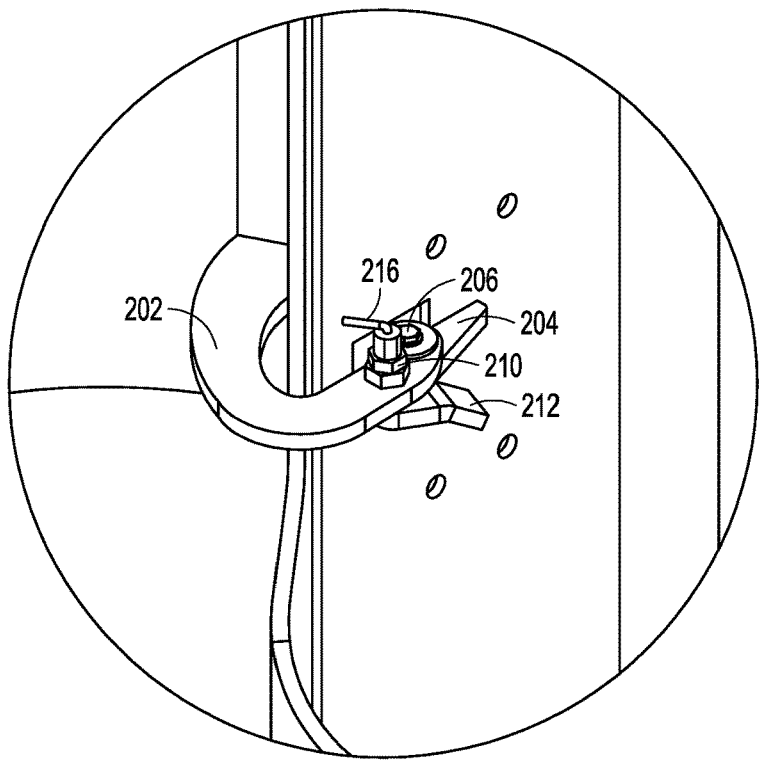
FIG. 2B is a detailed internal view of the region indicated in FIG. 1B, showing an example of the hinge arm and catch when the door is in an open position and the catch is engaged (e.g., locked stationary)

As shown in the examples of FIGS. 2A-2B, the internal hinge 200 can attach an interior of the door 104 to an interior of the wall of the cylindrical housing 102. In an example, the internal hinge 200 can include a pivoting curved hinge arm 202. The hinge 200 can also include a wall mount 204, which can be welded, fastened, or otherwise configured to be attached to the interior of the wall of the cylindrical housing 102. The hinge 200 can also include a pivot connection 206 between the hinge arm 202 and the wall mount 204. For example, the pivot connection 206 can include a pin extending through a receptacle on the hinge arm 202 and also through an aligned receptacle on the wall mount 204. The hinge 200 can further include a catch 208, The catch 208 can be integrated with or attached to the hinge arm 202, which helps avoid an alternative approach in which the catch may otherwise occupy a portion of the valuable interior space 103 within the housing 102 within which electronic components are to be located. For example, an alternative approach might include a separate rod extending from a fixed location within the interior space 103 of the housing 102 to a curved rail or slot on an interior of the door 104. However, with such an approach, the rod would intrude into the interior space 103 when the door 104 is closed.

The catch 208 can be configured for engagement, such as to inhibit opening of the door 104 beyond a specified maximum door opening angle, such as 90 degrees or preferably even greater, such as 100 degrees, 110 degrees, 120 degrees, or the like. A wider door opening angle can help provide better ease of access for a user seeking to access the interior space 103 within the housing 102, such as for installing, removing, or servicing the electronic components housed therewithin.

For example, the catch 208 can include a spring-loaded pull-pin or other pin 210. The catch 208 can also include a ramp 212 or other surface, such as can provide a glide path along which a distal end of the pin 210 can travel, such as during a portion of the pivoting of the curved hinge arm 202. A recess 214 be provided along the glide path of the ramp 212 or another surface. The recess 214 can be sized, shaped, or otherwise configured such as to receive the distal end of the pin 210 for engagement, such as to inhibit opening of the door 104 beyond a specified door opening angle. A spring-loaded push pin 210 can "self-engage" with the recess 214 when the distal end of the spring-loaded push pin 210 aligns with the recess 214 as the door 104 is opened to the specified door opening angle. This can occur without requiring additional user effort (other than opening the door 104) to accomplish the self-engagement. An opposite (proximal) end of the pin 210 can include a handle 216. For example, the handle 216 can include a 90 degree or other bent portion of the pin 210, an attached ball, or the like. The handle 216 can be sized, shaped, or otherwise configured to allow a user to easily grasp the handle 216, such as to manually pull on the pin 210 to disengage its distal end from the recess 214, such as to allow closing of the door 104.

A wall thickness of the cylindrical housing 102 can be larger than a wall thickness of the door 104. The pivoting curved hinge arm 202 can be shaped to define a notch region that is large enough to provide adequate clearance of the wall of the curved cylindrical housing 102 from the curved cylindrical section door 104 as the door 104 swings from a closed position that is flush with the wall of the cylindrical housing 102 to an open position at the specified maximum door opening angle, and at all angles therebetween.

In FIG. 1B, the door 104 can be affixed to the cylindrical housing 102 by a top internal hinge 200A and a bottom internal hinge 200B, each of which can optionally be welded or otherwise fastened to or integrally formed with a shared mounting strip or other member, which, in turn, can be welded or otherwise fastened to an interior portion of the door. The shared mounting strip can help provide alignment, structural rigidity, or both.

One environmental challenge when the electronics cabinet 100 is located outdoors is wind, which could otherwise blow the door 104 open or closed or into the user if not restrained by the catch 208. In an example, the configuration shown in FIGS. 1A, 1B, 2A, and 2B can be configured to withstand a wind speed of up to at least 30 miles per hour blowing the door 104 open before the respective catches 208 associated with the respective internal hinges 200A-B activate and limit further opening at the specified maximum door angle, without incurring damage or loss of function to the pivoting door 104. In an example, the configuration shown in FIGS. 1A, 1B, 2A, and 2B can be further configured to withstand a wind speed of up to at least 50 miles per hour blowing the door 104 shut, without disengaging the activated respective catches 208 associated with the respective internal hinges 200A-B activate and without incurring damage or loss of function to the pivoting door 104.

Figure 2C:
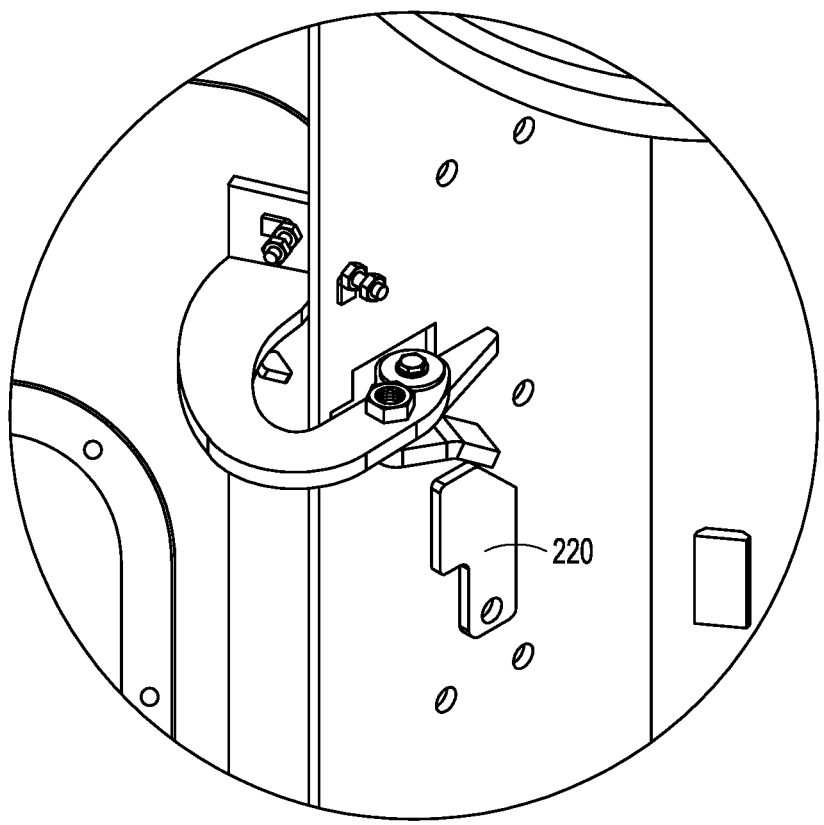
FIG. 2C is a detailed internal view of the region indicated in FIG. 1B, in which the spring-loaded pull pin has been omitted.

In an example, such as shown in the detail view of FIG. 2C, the electronics cabinet 100 can further include a lock retention member 220, which can be affixed to an interior of the cylinder housing 102. An access opening 222 can be defined in the door 104. The access opening 222 can be configured to receive a portion of the lock retention member 220 to permit access from outside of the cylindrical housing 102 when the door 104 is closed. The lock retention member 220 can include a through-hole, through which a padlock can be inserted to lock the door 104. An optional curved cylindrical section cover 224 can be secured above the padlock to conceal it from the outside and to preserve the flush cylindrical appearance of the electronics cabinet 100.

In an illustrative, non-limiting example, an internal diameter of the cylindrical housing 102 can be 20 inches, a height of the cylindrical housing 102 can be 84 inches, a height of the door 104 can be 53¾ inches, a height of the door opening can be 54 inches, a wall thickness of the cylindrical housing 102 can be ⅜ inches a wall thickness of the door 104 can be ⅛ inch. Some other illustrative non-limiting examples of the diameter of the cylindrical housing include 12 inches, 16 inches, 18 inches, 20 inches, or 24 inches.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronics cabinet comprising:
   a cylindrical housing, providing a wall defining an interior space for locating electronics equipment therein;
   a cylindrical section door, located in an access cutout defined by the wall;
   an internal hinge, attaching an interior of the door to an interior of the wall of the cylindrical housing, the internal hinge including:
      a pivoting curved hinge arm;
      a wall mount, configured to be attached to the interior of the wall of the cylindrical housing;
      a pivot connection between the hinge arm and the wall mount; and
      a catch, integrated with or attached to the hinge arm, the catch configured for engagement to inhibit opening of the door beyond a specified door opening angle, the catch including:
         a spring-loaded pull-pin; and
         a ramp providing a glide path along which the spring-loaded pull-pin travels during a portion of the pivoting of the curved hinge arm, the ramp includes a distal portion angled away from the pivoting curved hinge arm.

2. The electronics cabinet of claim 1, wherein the glide path includes a recess to receive an end of the pin for engagement to inhibit opening of the door beyond a specified door opening angle.

3. The electronics cabinet of claim 2, wherein the pin includes a handle at an opposite end from the end of the pin received by the recess.

4. The electronics cabinet of claim 1, wherein a thickness of the wall of the cylindrical housing is greater than a thickness of the door.

5. The electronics cabinet of claim 1, comprising a plurality of the internal hinges.

6. The electronics cabinet of claim 1, comprising:
   a lock retention member, affixed to an interior of the cylindrical housing; and
   an access opening, defined in the door, configured to receive a portion of the lock retention member to permit access from outside of the cylindrical housing when the door is closed.

7. The electronics cabinet of claim 1, wherein the catch is configured for engagement to inhibit opening of the door beyond a specified door opening angle exceeding 90 degrees.

8. The electronics cabinet of claim 1, wherein the internal hinge is located within an interior of the cylindrical housing and avoids having any externally protruding portions visible from outside of the cylindrical housing.

9. The electronics cabinet of claim 1, in which the catch is configured to remain engaged to inhibit closing of the door until a user manually disengages the catch.

10. An electronics cabinet comprising:
    a cylindrical housing, providing a wall defining an interior space for locating electronics equipment therein;
    a cylindrical section door, located in an access cutout defined by the wall;
    an internal hinge, attaching an interior of the door to an interior of the wall of the cylindrical housing, the internal hinge including:
       a pivoting curved hinge arm;
       a wall mount, configured to be attached to the interior of the wall of the cylindrical housing;
       means for allowing pivoting between the hinge arm and the wall mount; and
       a catch to inhibit opening of the door beyond a specified door opening angle, the catch including:
          a spring-loaded pull-pin; and
          an inclined glide path along which the spring-loaded pull-pin travels during a portion of the pivoting of the curved hinge arm so as to increase a spring-loading of the spring-loaded pull pin as the spring-loaded pull pin moves toward a recess.

11. The electronics cabinet of claim 10, wherein the catch that inhibits opening of the door beyond a specified door opening angle is configured to withstand a wind speed of 50 miles per hour without disengagement.

12. The electronics cabinet of claim 10, wherein the internal hinge is located within an interior of the cylindrical housing and avoids having any externally protruding portions visible from outside of the cylindrical housing.

13. The electronics cabinet of claim 10, in which the catch is configured to remain engaged to inhibit closing of the door until a user manually disengages the catch.

14. The electronics cabinet of claim 10, wherein the catch is configured for engagement to inhibit opening of the door beyond a specified door opening angle exceeding 100 degrees.

15. A method of accessing an electronics cabinet comprising a cylindrical housing, providing a wall defining an interior space for locating electronics equipment therein; a cylindrical section door, located in an access cutout defined by the wall; an internal hinge, attaching an interior of the door to an interior of the wall of the cylindrical housing, the internal hinge integrated with a catch for engagement to inhibit opening of the door beyond a specified door opening angle, the catch including a spring-loaded pull-pin and a ramp providing a glide path along which the spring-loaded pull-pin travels during a portion of a pivoting of a curved hinge arm, the ramp includes a distal portion angled away from the pivoting curved hinge arm, the method comprising:
    opening the door, thereby permitting the catch to self-engage the door in an open position and inhibit further opening of the door;
    disengaging the catch; and
    closing the door.

16. The method of claim 15, further comprising locking the door in a closed position.

17. The method of claim 15, wherein permitting the catch to engage the door includes inhibiting opening of the door beyond a specified door opening angle exceeding 90 degrees.

18. The method of claim 15, comprising inhibiting opening of the door beyond a specified door opening angle to withstand a wind speed of 50 miles per hour without disengaging the catch.

19. The method of claim 15, further comprising manually disengaging the catch to permit closing of the door.

20. The method of claim 15, further comprising a recess provided along the glide path of the ramp.

21. The method of claim 20, further comprising:
receiving a distal end of the spring-loaded pull pin with the recess to inhibit further opening of the door.

22. The method of claim 15, further comprising:
increasing loading on the spring-loaded pull pin as the spring-loaded pull pin moves toward a recess formed in the glide path provided by the ramp.

23. The method of claim 15, further comprising:
decreasing loading on the spring-loaded pull pin as the spring-loaded pull pin moves away from a recess formed in the glide path provided by the ramp.

* * * * *